United States Patent [19]

Ando et al.

[11] Patent Number: 4,796,076
[45] Date of Patent: Jan. 3, 1989

[54] SEMICONDUCTOR DEVICE

[75] Inventors: Hiroshi Ando; Yoshio Takagi, both of Itami, Japan

[73] Assignee: Mitsubishi Denki Kabushiki Kaisha, Tokyo, Japan

[21] Appl. No.: 19,561

[22] Filed: Feb. 27, 1987

[30] Foreign Application Priority Data

Feb. 28, 1986 [JP] Japan .................................. 61-29312

[51] Int. Cl.⁴ .............................................. H05K 7/02
[52] U.S. Cl. ................................... 357/65; 174/52.4; 361/388; 437/216
[58] Field of Search .......................... 357/65; 361/388; 174/52 FP; 437/215, 216, 217, 218, 219, 220, 221

[56] References Cited

U.S. PATENT DOCUMENTS

| 3,311,791 | 3/1967 | Larson et al. | 357/65 X |
|---|---|---|---|
| 3,705,258 | 12/1972 | Minks | 361/388 X |
| 3,940,786 | 2/1976 | Scheingold et al. | 357/74 |
| 4,038,678 | 7/1977 | Gottbrecht | 361/388 X |
| 4,181,384 | 1/1980 | Dola et al. | 29/844 X |
| 4,510,677 | 4/1985 | Collumeau | 174/52 FP X |
| 4,516,148 | 5/1985 | Barth | 357/65 X |
| 4,547,755 | 10/1985 | Roberts | 174/52 FPX |
| 4,591,950 | 5/1986 | Houpt | 174/52 FPX |
| 4,630,174 | 12/1986 | Kaufman | 174/52 FP |
| 4,657,325 | 4/1987 | Marks et al. | 361/388 X |

FOREIGN PATENT DOCUMENTS

| 3345285 | 6/1985 | Fed. Rep. of Germany | 357/65 |
|---|---|---|---|
| 59-200452 | 11/1984 | Japan | 357/65 |

Primary Examiner—R. R. Kucla
Attorney, Agent, or Firm—Birch, Stewart, Kolasch, & Birch

[57] ABSTRACT

A semiconductor device which is designed to have a plurality of electrodes on an upper surface of a lid portion has a recessed portion which is provided on this upper surface of the lid portion. The recessed portion will accept an electrode after it is bent from its initial position to a position such that the electrode will partially reside in this recessed portion.

2 Claims, 2 Drawing Sheets

SEMICONDUCTOR DEVICE

FIELD OF THE INVENTION

The present invention relates to a semiconductor device, and more particularly to that having an improved lid portion in a flat base type semiconductor device.

BACKGROUND ART

FIG. 3 shows a perspective view of a lid portion of a prior art semiconductor device before the electrode of the device is bent.

In FIG. 3, the reference numeral 1 designates a lid portion constructed by plastic forming. The reference numeral 2 designates a recessed portion provided on the lid portion 1 so as to enable insertion of a nut. The reference numeral 3 designates an electrode which is inserted into the lid portion 1 during plastic molding. The reference numeral 4 designates a center line of the electrode 3. The reference numeral 5 designates a supposed line showing a position to which the center line 4 is to come when no distortion arises in the electrode bending process. The reference numeral 6 designates a supposed line showing a position to which the center line 4 is supposed to come when some distortion arises in the electrode bending process. The reference numeral A designates a line showing a direction along which the electrode is bent. FIG. 4 is a perspective view showing the same lid portion as that of FIG. 3, but this FIG. 4 illustrates a state after the electrode bending process.

The bending process of the electrode will be described.

Nuts (not shown) are inserted into the recessed portions 2 of the lid portion 1 in a state shown in FIG. 3. Thereafter bending of the electrodes 3 is conducted and the arrangement shown in FIG. 4 is obtained. When the electrode 3 is accurately bent with no deviations during the bending process, the center line 4 is aligned with the line 5. In this case, the center of the nut inserted into the recessed portion 2 is situated on the supposed line 5, whereby no difficulty will arise in the insertion of a screw. However, when the center line 4 is aligned on one of the lines 6 due to some deviation (such as an improper force application during the electrode bending process), the center of the nut is not situated on the supposed line 6. Difficulty will then arise in the insertion of a screw as well as tremendously worsening the external appearance. The longer the length X of the electrode 3, the more likely such deviations are to arise and such deviations are likely to have a greater positional deviation. Furthermore, when such deviations arise, the position of the curved electrode 3 must be modified. In order to avoid such problems, the electrode bending process must be conducted quite precisely.

The prior art semiconductor device is constructed in such a manner, and the electrode is likely to be distorted and curved due to some deviations during the bending process. This causes an obstruction to screw insertion and detracts from the external appearance. This also requires considerable precision during the electrode bending process.

SUMMARY OF THE INVENTION

An object of the present invention is to provide a semiconductor device capable of being produced with high precision even by rough operation during the electrode bending process.

Another object of the present invention is to provide a semiconductor device having an improved appearance.

Other objects and advantages of the present invention will become apparent from the detailed description given hereinafter. It should be understood, however, that the detailed description and specific embodiment are given by way of illustration only, since various changes and modifications within the spirit and scope of the invention will become apparent to those skilled in the art from this detailed description.

According to the present invention, there is provided a semiconductor device which is designed to have a plurality of electrodes at the upper surface of a lid portion, wherein a recessed portion is provided at the upper surface of said lid portion so as to accept insertion of said electrode.

BRIEF DESCRIPTION OF THE DRAWINGS

The present invention will become more fully understood from the detailed description given hereinbelow and the accompanying drawings which are given by way of illustration only; and thus are not limitative of the present invention, and wherein.

DETAILED DESCRIPTION OF THE PREFERRED EMBODIMENTS

In order to explain the present invention in detail, reference will be made particularly to FIG. 1.

Figure 1:
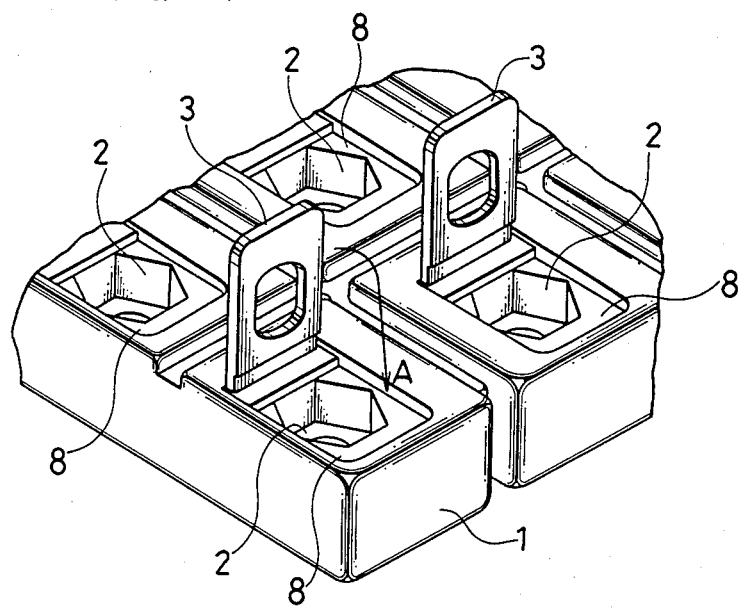
FIG. 1 is a perspective view showing a lid portion of a semiconductor device of the present invention in a state before bending of the electrodes.
Figure 2:
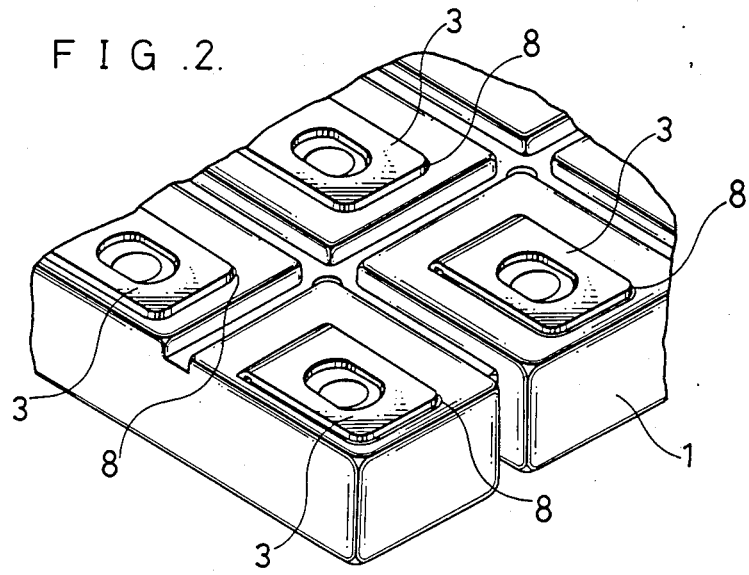
FIG. 2 is a perspective view showing the lid portion of the embodiment after bending of the electrode.

FIG. 1 shows a lid portion of a semiconductor device as an embodiment of the present invention before receiving an electrode. FIG. 2 shows the lid portion after receiving an electrode.

Figure 3:
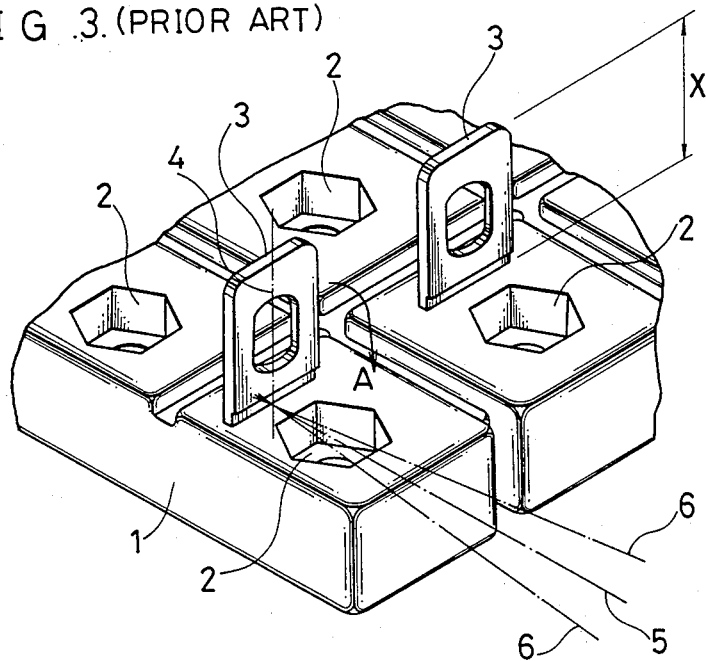
FIG. 3 is a perspective view showing a lid portion of a prior art semiconductor device before bending of the electrode.
Figure 4:
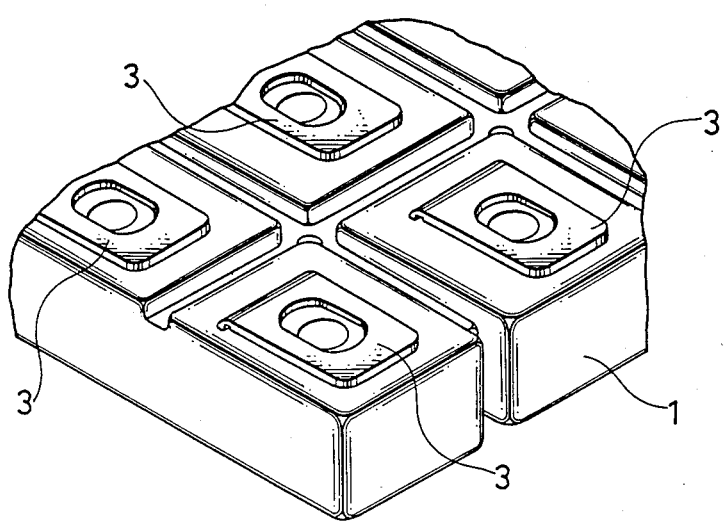
FIG. 4 is a perspective view showing the lid portion of the prior art device after bending of the electrode.

In FIGS. 1 and 2, the reference numerals 1 to 3 designate the same elements as those shown in FIGS. 3 and 4. The reference numeral 8 designates a recessed portion which is provided on the upper surface of the lid portion 1 and has the same configuration as the outer configuration of the electrode 3 so that the bent electrode 3 is inserted thereinto. The depth of the recessed portion 8 is slightly shallower than the thickness of the electrode 3 such that the upper surface of the bent and inserted electrode 3 is positioned about half of its thickness above the upper surface of the lid portion 1.

In this embodiment the electrode is subjected to bending so as to be inserted into the recessed portion 8. Then, the recessed portion 8 functions as a guide for the electrode 3 being bent. Thus, the electrode 3 will not be distorted during bending and there arises no deviations to inconvenience the screw insertion. Thus, the bending process of the electrode 3 is facilitated. Furthermore, as the recessed portion 8 is shallower than the thickness of the electrode 3, the electrode 3 projects from the upper surface of the lid portion 1. This results in no obstruction to busbar wiring. Furthermore, distortions of electrodes during the bending process can be diminished even when long-sized electrodes are employed.

In the above-illustrated embodiment, the lid portion is produced separately from the case, but this lid portion can be produced integrated with the case with the same effects as described above.

As is evident from the foregoing description, according to the present invention, a recessed portion is provided on a lid portion so as to function as a guide for an electrode being bend during a bending process. This construction enables the electrode being bent along the edge of the recessed portion to avoid distortions even during a rough or nonprecise electrode bending operation. This results in an easy electrode bending process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device having a lid portion, said semiconductor device comprising:

a plurality of electrodes at an upper surface of said lid portion, said electrodes each having a given configuration and initially being positioned in a substantially vertical position generally perpendicular to said upper surface of said lid portion, said electrodes having a predetermined thickness; and said lid portion defining recessed portions therein, each of said electrodes having a recessed portion for receiving said electrode after said electrode is bent from said substantially vertical position to a substantially horizontal position relative to said upper surface of said lid portion, said recessed portions guiding said electrodes as said electrodes are bent to said substantially horizontal position for avoiding deviations in positioning said electrodes in said substantially horizontal position, said recessed portions each having a configuration which substantially corresponds to the configurations of said electrodes such that said electrodes are encircled by and mated with said recessed portions when said electrodes are bent to said substantially horizontal position, said recessed portions each having a predetermined depth, and said predetermined depth of said recessed portions being slightly less than said predetermined thickness of said electrodes such that said electrodes in said horizontal position fail to be completely flush with said upper surface of said lid portion.

2. The semiconductor device as recited in claim 1 wherein said electrodes and said recessed portions each have side edges which are generally parallel when said electrodes are bent to said horizontal position, said side edges of said electrodes incrementally contacting said side edges of said recessed portions as said electrodes are bent for contacting increased portions of said side edges of said electrodes with said side edges of said recessed portions as said electrodes approach said substantially horizontal position and for accomplishing the guiding of said electrodes by said recessed portions.

* * * * *